United States Patent [19]

Holler et al.

[11] Patent Number: 4,956,564
[45] Date of Patent: Sep. 11, 1990

[54] ADAPTIVE SYNAPSE CELL PROVIDING BOTH EXCITATORY AND INHIBITORY CONNECTIONS IN AN ASSOCIATIVE NETWORK

[75] Inventors: Mark A. Holler, Palo Alto; Simon M. Tam, Redwood City; Hernan A. Castro, Shingle Springs, all of Calif.

[73] Assignee: Intel Corporation, Santa Clara, Calif.

[21] Appl. No.: 379,933

[22] Filed: Jul. 13, 1989

[51] Int. Cl.$^5$ ............................................. H03K 19/21
[52] U.S. Cl. ...................................... 307/201; 307/450; 307/464; 307/529; 364/807; 365/185
[58] Field of Search ................ 307/443, 201, 450, 464, 307/465, 468, 469, 490, 501, 529; 364/513, 807; 365/45, 115, 167, 184, 185

[56] References Cited

U.S. PATENT DOCUMENTS

| | | | |
|---|---|---|---|
| 4,660,166 | 4/1987 | Hopfield | 364/807 |
| 4,663,740 | 5/1987 | Ebel | 365/185 |
| 4,695,979 | 9/1987 | Tuvell et al. | 365/185 |
| 4,742,492 | 5/1988 | Smayling et al. | 365/185 X |
| 4,760,437 | 7/1988 | Denker et al. | 357/30 |
| 4,782,460 | 11/1988 | Spencer | 364/807 |
| 4,802,103 | 1/1989 | Faggin et al. | 364/513 |
| 4,873,661 | 10/1989 | Tsividis | 307/201 X |
| 4,874,963 | 10/1989 | Alspector | 307/201 |
| 4,875,183 | 10/1989 | Graf | 364/807 |

OTHER PUBLICATIONS

Mead, *Analog VLSI and Neural Systems*, pp. 79–117.
Hoffman et al., "Neurons With Hysteresis Form a Network That Can Learn Without Any Changes in Synaptic Connection Strengths", *AIP Conf. Proceedings*, vol. 151, 1986, pp. 219–226.
"VLSI For Artificial Intelligence", Edited by Jose G. DelGado-Frias and Will R. Moore, Kluwer Academic Publishers, 1989, pp. 230–233.
"Programmable Analog Synapses for Micro Electronic Neural Networks Using a Hybrid Digital–Analog Approach", by F. J. Mack et al., IEEE International Conference on Neural Networks, Jul. 24–27, San Diego, Calif.
"A Pipelined Associative Memory Implemented in VLSI", by Clark et al., IEEE Journal of Solid–State Circuits, vol. 24, no. 1, pp. 28–34, Feb. 1989.

*Primary Examiner*—David Hudspeth
*Attorney, Agent, or Firm*—Blakely, Sokoloff, Taylor & Zafman

[57] ABSTRACT

The present invention covers a synapse cell for providing a weighted connection between an input voltage line and an output summing line having an associated capacitance. Connection between input and output lines in the associative network is made using one or more floating-gate transistors which provide both excitatory as well as inhibitory connections. As configured, each transistor's control gate is coupled to an input line and its drain is coupled to an output summing line. The floating-gate of the transistor is used for storing a charge which corresponds to the strength or weight of the neural connection. When a binary voltage pulse having a certain duration is applied to the control gate of the floating-gate transistor, a current is generated which acts to discharge the capacitance associated with the output summing line. The current, and therefore the resulting discharge, is directly proportional to the charge stored on the floating-gate member and the duration of the input pulse.

15 Claims, 3 Drawing Sheets

FIG_1
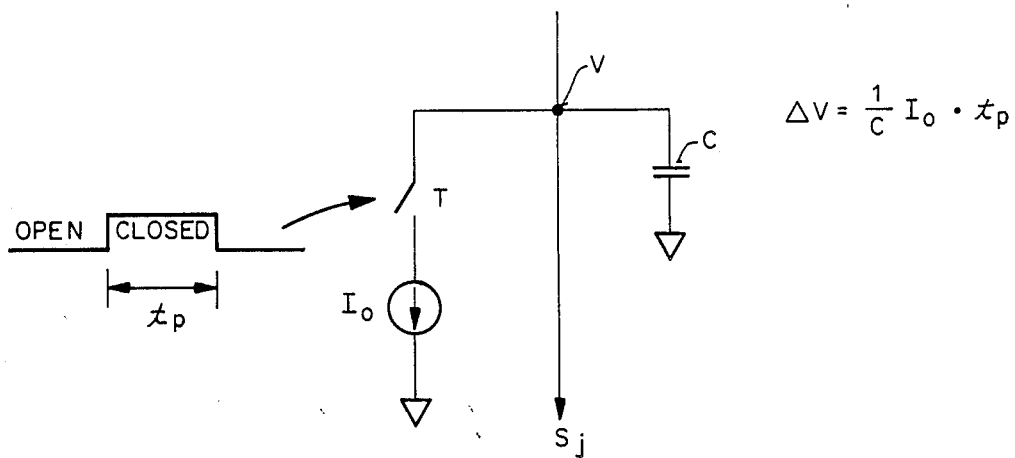
$\Delta V = \frac{1}{C} I_o \cdot t_p$
FIG_2
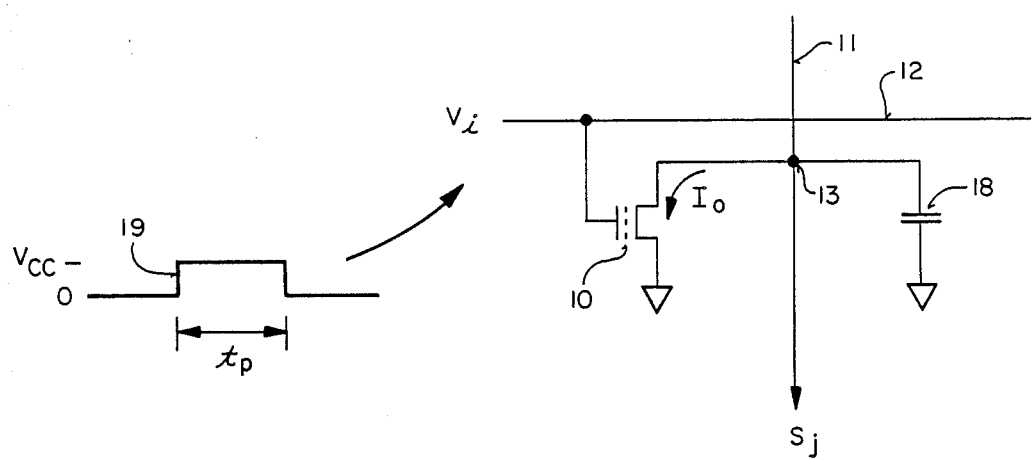
FIG_3
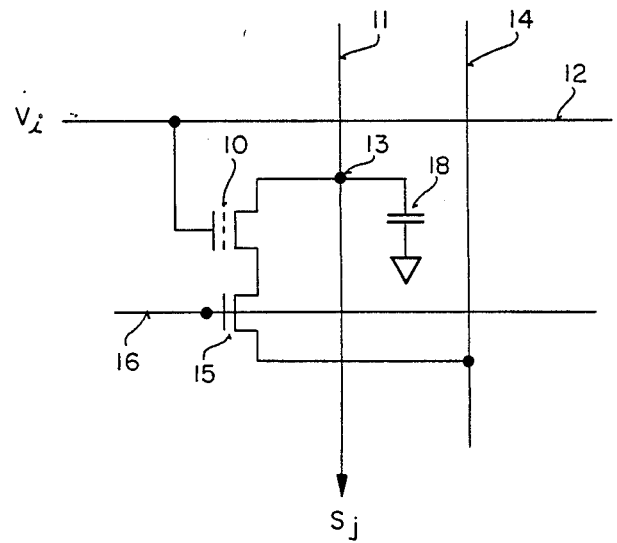

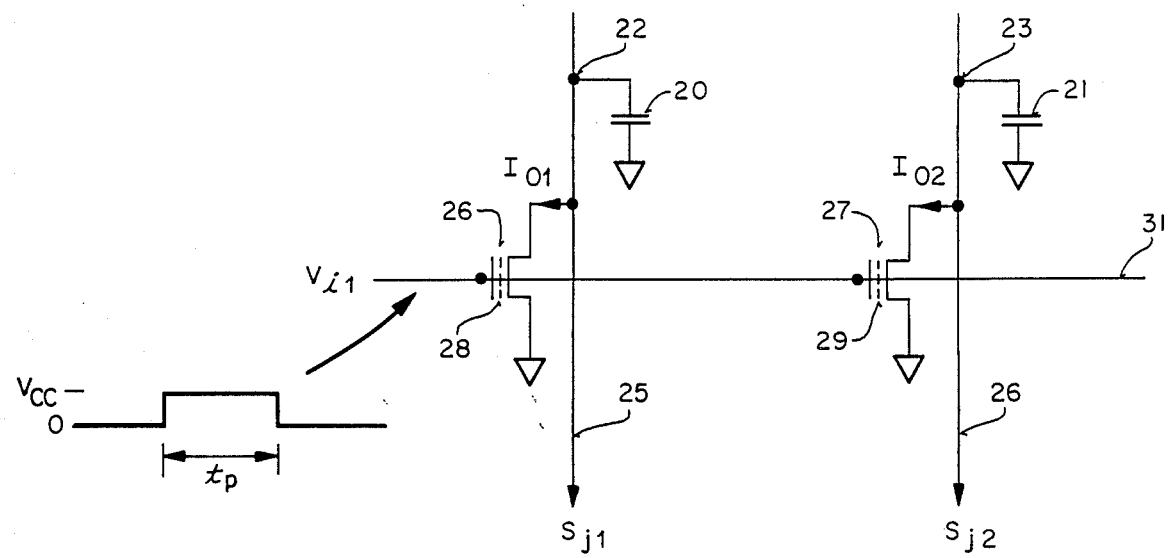
FIG_4
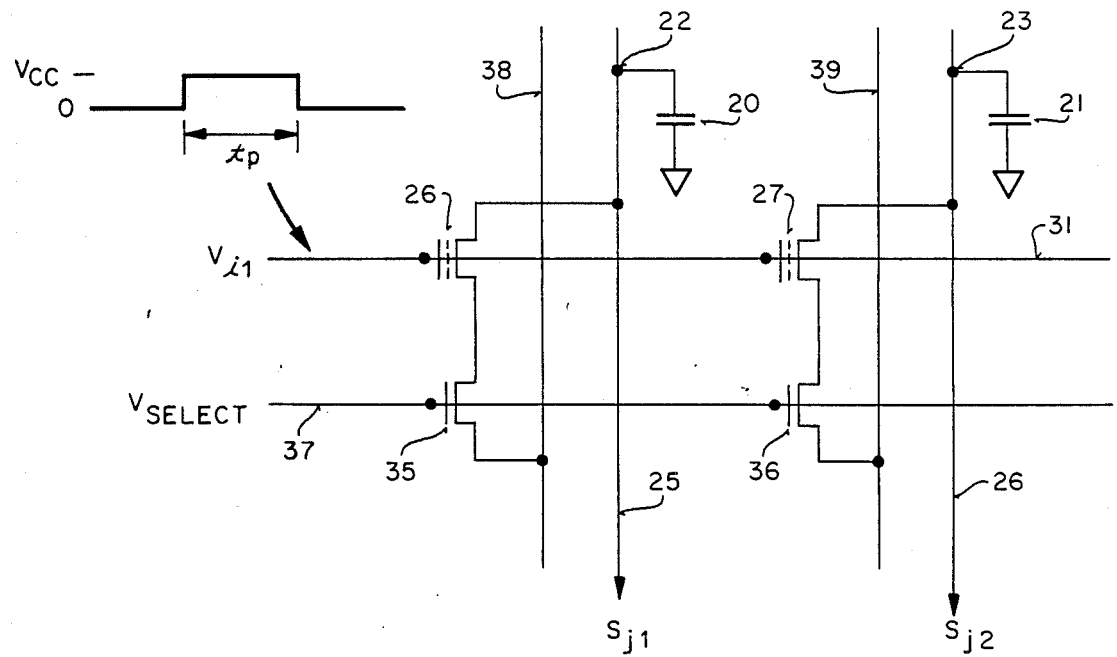
FIG_5

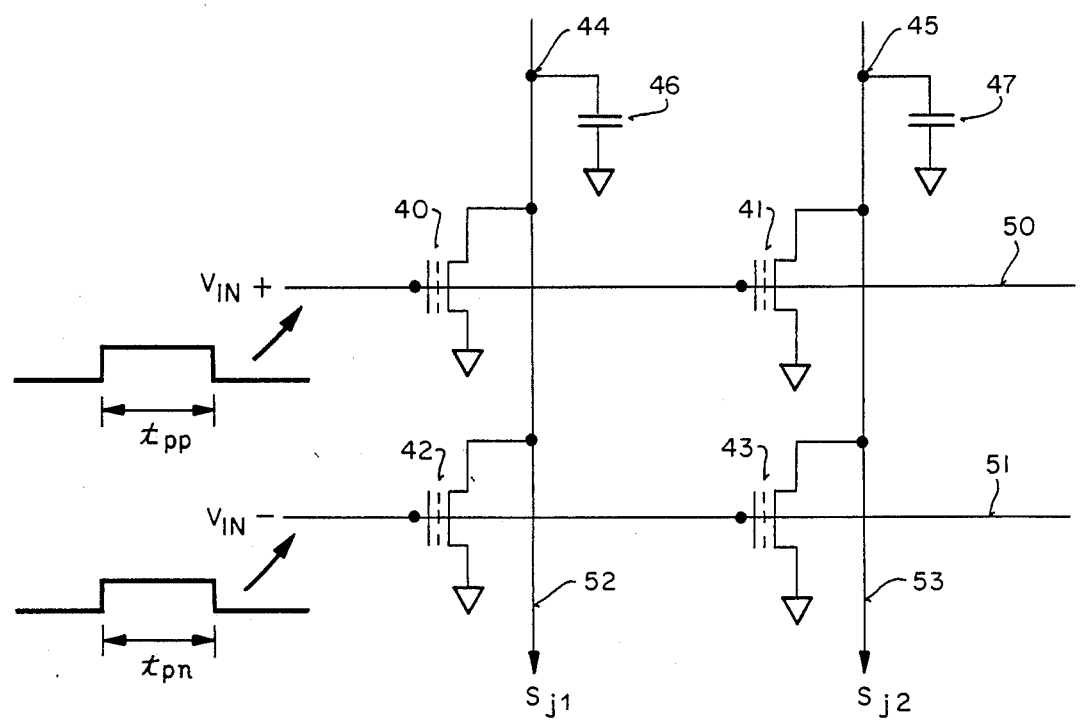
FIG_6
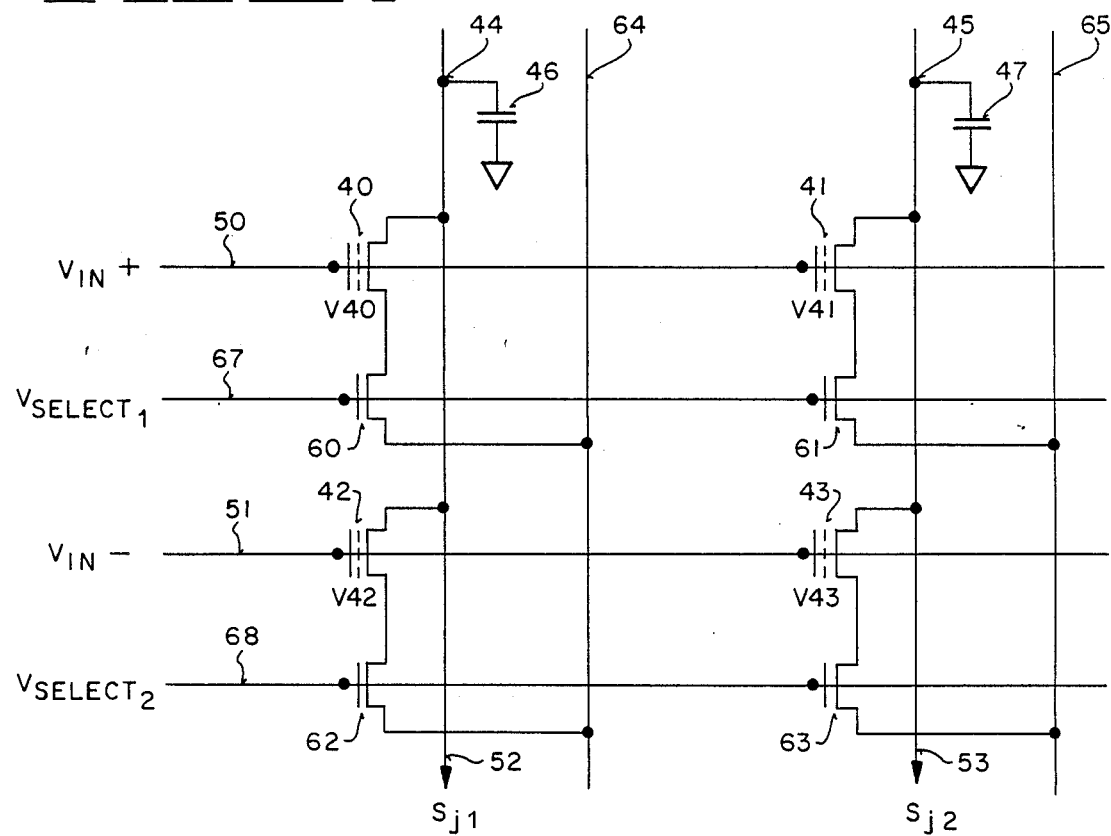
FIG_7

ADAPTIVE SYNAPSE CELL PROVIDING BOTH EXCITATORY AND INHIBITORY CONNECTIONS IN AN ASSOCIATIVE NETWORK

FIELD OF THE INVENTION

The invention pertains to the field of associative networks for emulating higher-order functions performed in the cortex of the human brain. More particularly, the invention pertains to synapse cells which provide a weighted connection between an input voltage vector and a neural summing device.

BACKGROUND OF THE INVENTION

A great deal of effort has recently been focused on developing electronic circuits which emulate higher-order brain functions such as memory learning and/or perception/recognition.

One class of circuit devices which sense an input event and output a pattern of signals which identifies that event are associated networks. Association networks generally take the form of a matrix comprised of horizontal lines crossing and contacting an equally sized set of vertical lines. The horizontal lines simulate the functions of axons in the cortex of the brain and are used as inputs. The vertical lines simulate the function of dendrites extending from neurons. Each vertical line terminates at a voltage summing device which acts to simulate the function of the neuron cell body. An example of such an associative network is found in co-pending application entitled "Semiconductor Cell For Neural Network Employing A Four-Quadrant Multiplier", Ser. No. 283,553, filed Dec. 9, 1988, which is assigned to the assignee of the present application.

Within an associative network, neural synapses are simulated by circuit cells which provide electrical connection between the horizontal and vertical lines of the network. Individual synapses provide a weighted electrical connection between an input an a voltage summing element, i.e., a neuron.

These synapse cells may be either analog or digital in nature. For an analog implementation, the weighted sum of input signals is usually computed by summing analog currents or charge packets. For a general description of an associative network processing unit consisting of analog connection elements, see "VLSI for Artificial Intelligence", edited by Jose G. DelGado-Frias and Will R. Moore, Kluwer Academic Publishers, 1989, pp. 230–233.

One of the most difficult and critical tasks faced by researchers in the field of neural networks is the integration of the synapse cells, also referred to as contact structures. The several realizations that have been proposed range from non-programmable binary to programmable analog interconnections.

In an analog synapse cell, considerations of cell size and resolution of the connection weight must be carefully balanced. Furthermore, learning within an associative network requires adaptive weight values since a typical network system cycles through a series of weight changes until the entire network converges to a certain pattern which depends upon the pattern of inputs applied. Several synapse cell circuits are described in co-pending applications "EXCLUSIVE-OR Cell For Neural Network Cell And The Like", Ser. No. 309,247, filed Feb. 10, 1989; and "EXCLUSIVE-OR Cell For Pattern Matching And Employing Floating-Gate Devices", Ser. No. 325,380, filed Mar. 17, 1989, both of which are assigned to the assignee of the present application.

FIG. 2 of U.S. Pat. No. 4,802,103 of Faggin et al., discloses a contact structure which utilizes a floating-gate transistor 34. Device 34 is used to discharge a target line of the network in proportion to the amount of charge stored on the floating gate member of device 34. The magnitude of the convergence response of the network is altered by incrementally erasing the floating gate transistors. In other words, the connection strength is increased to increase the discharge current associated with the target line. A detecting circuit indicates a convergence response once a predetermined amount of charge is removed from the target line.

The chief drawback of the contact structure of Faggin's FIG. 2 is that it operates as a simple one-quadrant device. That is, Faggin's synapse cell only produces a positive activation function, corresponding to an activated excitatory connection. It is well understood that biological memories accommodate both excitatory and inhibitory connections—thus providing both positive and negative responses. A cell providing both excitatory and inhibitory connections would more closely resemble the actual function performed by a synapse within the human brain. Moreover, such a cell would have the potential to learn quicker, thereby providing faster convergence within an associative network. What is needed therefore is an integrated multi-quadrant synapse cell which can produce both positive and negative responses.

As will be seen, the present invention covers a synapse cell employing one or more floating-gate transistors. Various embodiments of the invention offer the advantage of multi-quadrant performance which provides the ability to make inhibitory as well as excitatory connections within an associative network. Furthermore, the cell of the present invention achieves very high densities while still providing full incremental learning capabilities.

Other prior art known to Applicant includes: U.S. Pat. No. 4,760,437 of Denker et al.; U.S. Pat. No. 4,660,166 of Hopfield; U.S. Pat. No. 4,782,460 of Spencer; "Programmable Analog Synapses For Microelectronic Neural Networks Using A Hybrid Digital-Analog Approach", by F. J. Mack et al., *IEEE International Conference on Neural Networks*, Jul. 24–27, San Diego, Calif.; and "A Pipelined Associative Memory Implemented In VLSI", by Clark et al., *IEEE Journal of Solid-State Circuits*, Vol. 24, No. 1, pp. 28–34, Feb. 1989.

SUMMARY OF THE INVENTION

The present invention covers a synapse cell for providing a weighted connection between an input line and an output summing line having an associated capacitance. Connection between input and output lines in the associative network is made using a floating-gate transistor wherein the transistor's control gate is coupled to the input line and its drain is coupled to the output line. The output summing line in an associative network is usually connected to a voltage sensing element, such as a non-linear amplifier, which simulates the function of the neuron body in a biological neuron.

The floating-gate of the transistor is used for storing a charge which corresponds to the strength or weight of the neural connection. When a binary voltage pulse having a certain duration is applied to the control gate of the floating-gate transistor, a current is generated. This current acts to discharge the capacitance associated with the output summing line. Since the current, and therefore the resulting discharge, is directly proportional to the charge stored on the floating-gate member and the duration of the input pulse, the synapse cell of the present invention performs a multiplication function.

BRIEF DESCRIPTION OF THE DRAWINGS

The novel features believed characteristics of the invention are set forth in the appended claims. The invention itself, however, as well as other features and advantages thereof, will be best understood by reference to the detailed description which follows, read in conjunction with the accompanying drawings, wherein:

FIG. 1 shows a basic circuit model of a contact structure which emulates the function of a synapse in the cortex of the human brain.

FIG. 2 shows a synapse cell employing a single floating-gate transistor.

FIG. 3 illustrates the one-quadrant synapse cell of FIG. 2 also having an additional transistor to facilitate selective programming/erasing.

FIG. 4 shows one embodiment of the present invention which provides two-quadrant multiplication of an input voltage and a stored weight.

FIG. 5 shows the currently preferred embodiment of the present invention in which the two-quadrant cell of FIG. 4 incorporates additional transistors to facilitate selective programming/erasure.

FIG. 6 illustrates a four-quadrant synapse cell connecting a differential input to a differential output summing line.

FIG. 7 shows the four-quadrant cell of FIG. 6 incorporating additional transistors to facilitate selective programming/erasure.

DETAILED DESCRIPTION OF THE PREFERRED EMBODIMENT(S)

Referring to FIG. 1, there is shown a basic circuit model of a contact structure which emulates the function of a synapse in the human brain (for reference, see p. 104 of "Principles of Neuroscience" by Kandell & Schwartz, 2nd ed., Elsevier). The circuit of FIG. 1 includes an analog current summing line $S_j$ which terminates at the input of a neural summing device. Line $S_j$ carries the sum of the individual current contributions of each of the synapse cells associated with that line. Line $S_j$ is shown having a capacitance C coupled to node V. Also connected to node V is a switched current source supplying a constant current of $I_o$ when switch T is closed. The circuit of FIG. 1 is activated during the time interval $t_p$ when switch T is closed.

As would be evident to one skilled in the art, the circuit of FIG. 1 is a basic capacitive discharging circuit. A predetermined amount of charge stored on capacitor C is drained in direct proportion to the product of the current $I_o$ and the time interval $t_p$. Thus, using the basic contact structure of FIG. 1, an input signal in the form of a voltage pulse having a non-zero duration produces a convergence response which may then be totaled with other responses and compared to a threshold value.

The change in voltage which occurs at node V in response to an input pulse is a multiple of the current $I_o$ (i.e., stored weight) and the time period $t_p$ (i.e., cell input to the), as given by the equation $$\Delta V = \frac{1}{C} I_o t_p$$

A simple learning rule for programming the contact structure of FIG. 1 is to increase the current $I_o$ for all contacts coupled to an active input line and a summing line from which a response is desired. This has the effect of strengthening the synaptic connection.

FIG. 2 illustrates a good functional integration of the contact structure represented by the circuit model of FIG. 1. In FIG. 2, the constant current source $I_o$ is realized by a transistor 10 which has a floating-gate member that is electrically chargeable. Most often, transistor 10 is fabricated with a polysilicon floating-gate which is completely surrounded by insulation (e.g., silicon dioxide). Charge is transferred out of the floating-gate through a variety of mechanisms such as avalanche injection, channel injection, tunnelling, etc. It is the charge on the floating-gate which affects the conductivity of the device. If the conductivity is above a certain level, the device is deemed to be programmed in one binary state. If the conductivity is below another level, it is deemed to be programmed in the other binary state. For analog applications, the floating-gate charge is controlled to provide intermediate levels of conductivity between the upper and lower limits.

Floating-gate transistors take a variety of forms in the prior art, some being both electrically erasable and electrically programmable and others requiring, for example, ultra violet light for erasing. These non-volatile storage devices are frequently referred to in the prior art as EPROMs, EEPROMs or flash EEPROMs. The currently preferred embodiment of the present invention employs standard flash EPROM devices augmented with ordinary select transistors, although standard EEPROMs or EPROMs may be readily substituted without detracting from the spirit or scope of the present invention.

With reference to FIG. 2, the application of an input voltage pulse having a non-zero duration $t_p$ to input line 12 (labeled $V_i$) causes a current $I_o$ to flow in transistor 10. The magnitude of the current $I_o$ depends on the stored charge programmed onto the floating-gate of transistor 10. As is shown, the control gate of device 10 is coupled to input line 12, the drain of device 10 is coupled to node 13 of line 11 and the source is grounded. The current $I_o$ acts to incrementally discharge capacitor 18 connected to line 11 at node 13. This causes a corresponding change in the voltage present on line 11.

Consider in more detail the case wherein an input voltage pulse of a certain duration $t_p$ is applied to input line 12. The value of the input voltage is digital in nature, assuming either a value of 0 volts or the supply potential, e.g., $V_{CC}$. The pulse width, however, is analog in nature and is used to represent a value in a continuum of possible input values. Upon the arrival of the input pulse on line 12, floating gate transistor 10 conducts a current $I_o$. Of course, the magnitude of the current $I_o$ depends on the actual charge residing on the floating-gate member of transistor 10. Preferably, transistor 10 is an n-channel device so that if a large amount of negative charge resides on the floating-gate member, then the magnitude of $I_o$ will be relatively small. On the other hand, if a small amount of negative charge, or a positive charge, resides on the floating-gate then the magnitude of $I_o$ will be relatively large.

As discussed, the current $I_o$ acts to drain a predetermined amount of charge from capacitor 18. It is appreciated that the charge may be stored in a variety of alternative ways. For instance, instead of using a separate storage capacitor, the parasitic capacitance associated with line 11 may itself be used to store the charge.

During the time that input line 12 is high, a quantity of charge is drained off of line 11 which corresponds directly to the product of the current $I_o$ and the time period $t_p$. The voltage at node 13 drops accordingly. Hence, the invented synapse cell of FIG. 2 acts as a type of one-quadrant multiplier—providing an output which depends upon the product of an input pulse width and the amount of charge stored on the floating-gate of transistor 10 (i.e., the stored charge on the floating-gate representing the adaptive weight).

Use of pulse widths to represent inputs to the synapse cell is more power efficient than conventional voltage level-sensing schemes because current flows only during the active portion of the pulse width, i.e., when the pulse is "high". Therefore, quiescent power consumption in the cells is markedly reduced.

To reduce transient current spikes, the leading edge transitions 19 (see FIG. 2) of the input pulses applied to the various synapses may be randomly skewed in time with respect to one another. One way to accomplish this would be to utilize a high-speed free-running clock to drive a counter which would then trigger the various transition points of the input pulses. In this way, the input pulses would be applied relatively asynchronously with respect to the other pulses; never allowing a multitude of transitions to occur at the same time. If a plurality of input pulses were synchronized so that their leading edge transistions 19 occurred simultaneously, large transient currents would result. Obviously, such currents are undesirable. Note that the human brain generates pulses which are asynchronous, possibly for the same reason.

Programming and erasing of the cell of FIG. 2 can be accomplished in the manner well-known in the prior art. For example, for the case in which flash EPROM devices are employed, device 10 may be programmed by taking its control gate (connected to input line 12) and its drain (connected to summing line 11) to a high positive potential. High positive voltages on the control gate and the drain of device 10 cause hot-electrons to be injected onto the floating-gate, thereby raising its threshold.

All of the floating-gate transistors within the associative network can be erased simultaneously by raising the common source to a high positive potential as is typically done in flash EPROM devices. For instance, to erase transistor 10, the control gate connected to line 12 is taken to a voltage at or near ground potential. The application of a high positive potential to the common source, while its control gate is grounded, causes electrons to tunnel from the floating gate to the source. This "erase process" reduces the threshold of the floating-gate transistor.

To erase floating-gate devices within a synapse cell more selectively, a separate source select field-effect device is required. Such a circuit configuration which includes a source select field-effect device 15 is shown in FIG. 3. Device 15 comprises an ordinary n-channel MOS transistor. When the select line 16, coupled to the gate of device 15, is raised to a high positive potential, the source of transistor 10 is electrically coupled to line 14. A high positive programming potential (e.g., $V_{PP}$) is then applied to the source of floating-gate device 10 via line 14. During a selective erase, all of the other select lines within the network will generally be grounded. In a normal read or association operation all of the select lines in the network are taken high and their associated programming potential lines (e.g., line 14) are grounded.

The addition of select device 15 roughly doubles the cell size of the connection element; however, device 15 does add the ability to change the stored weight in either direction, i.e., either positive or negative. For instance, the weight stored in device 10 may be either increased, by incremental programming (i.e., charging) of the floating-gate member of device 10, or decreased by incrementally erasing (i.e., discharging) device 10.

Because the cortex of the human brain has both excitatory as well as inhibitory connections, an accurate synapse implementation must be able to produce positive as well as negative responses. This means that the synapse cell must be capable of either two-quadrant or four-quadrant multiplication. It has been shown that inhibitory connections are necessary for a neural network to be fully general for mapping input patterns to output patterns.

The synapse cell of FIG. 4 implements a two-quadrant multiply in which a differential voltage is produced in response to an input voltage pulse. The cell includes two floating-gate transistors 26 and 27 each having a corresponding floating-gate member 28 and 29, respectively. Transistor 26 has its drain coupled to current summing line 25 (labeled $S_{j1}$) while transistor 27 has its drain coupled to current summing line 26 (labeled $S_{j2}$). The capacitances associated with lines 25 and 26 are represented in FIG. 4 by capacitors 20 and 21, coupled to nodes 22 and 23, respectively. (It is understood, of course, that the actual implementation of capacitors 20 and 21 may take a variety of forms, as mentioned above).

A bipolar weight patten (the term "bipolar" in this context refers to the ability of the weight to be either excitatory or inhibitory) is stored in the cell of FIG. 4 by programming different voltages onto floating-gate members 28 and 29. By way of example, a positive weight may be defined by a voltage $V_{28}$ on floating-gate member 28 which is greater than a voltage $V_{29}$ stored on floating-gate member 29. Logically, a negative weight is then defined by the case in which $V_{29}$ is greater than $V_{28}$.

Upon the application of a voltage input pulse of duration $t_p$, each floating-gate transistor conducts a current which is directly related to the stored weight. For instance, for the case in which positive weight has been programmed (i.e., $V_{28} > V_{29}$) the current $I_{o1}$ is made larger than the current $I_{o2}$. Therefore, the change in the voltage associated with the voltage at node 22 will be greater than the change in voltage at node 23 (i.e., more electrical charge will be removed from capacitor 20 than from capacitor 21). This result may be conventionally defined as a positive output response. A negative output response would result whenever $I_{o2}$ is greater than $I_{o1}$, with capacitor 21 discharging more than capacitor 20. Thus, the cell of FIG. 4 is capable of producing both excitatory and inhibitory connections to a neural summing device.

Referring now to FIG. 5, the two-quadrant synapse cell of FIG. 4 is shown incorporating additional transistors 35 and 36 to facilitate selective programming and erasing of floating-gate devices 26 and 27. Select transistors 35 and 36, which in the preferred embodiment are ordinary n-channel MOS devices, both have their gates coupled to select line 37 and their drains coupled to the sources of floating-gate transistors 26 and 27, respectively; their sources are coupled to common source lines 38 and 39, respectively.

As described in conjunction with FIG. 3, the addition of select devices 35 and 36 adds the ability to alter, or adapt, individual stored weights in either direction. This gives the synapse cell of FIG. 5 the potential for faster learning (i.e., quicker convergence response) when compared to simpler one-quadrant structures.

It is appreciated that by using time integration techniques the need for precise matching of the transistor devices is considerably relaxed. As long as the current flowing through each of the floating-gate devices remains constant during the time $t_p$, the multiplication process will be linearly precise (assuming, of course, that the associated summing line capacitance is itself linear). Further, by providing the capacity for incremental programming and erasing through the use of select devices 35 and 36, the circuit of FIG. 5 supports full incremental learning in an associative network.

A synapse capable of full four-quadrant multiply is important because it allows representation of input vector components in the range from −1 to +1 instead of from 0 to +1. The length (i.e., magnitude) of vectors with components in the range from −1 to +1 is nearly constant while the length of vectors with components in the range from 0 to +1 varies considerably. Neurons with synapses which carry out a dot product calculation can more reliably learn to recognize different pattern vectors of equal lengths as opposed to vectors whose length varies.

Full four-quadrant multiplication is achieved by using differential input and output lines as shown in FIG. 6. The synapse cell of FIG. 6 comprises input lines 50 and 51 coupled to the gates of floating-gate transistors 40, 41 and 42, 43, respectively. The drains of transistors 40 and 42 are coupled to current summing line 52 (labeled $S_{j1}$), while the drains of devices 41 and 43 are coupled to current summing line 53 (labeled $S_{j2}$). Summing line 52 has an associated capacitance 46 coupled at node 44 and current summing line 53 has a similar capacitance 47 coupled at node 45.

For positive inputs, a voltage pulse having a time period $t_{PP}$ is supplied to line 50, for example, while for negative inputs, a voltage pulse of time period $t_{PN}$ may be applied to input line 51. As before, the length or duration of the pulse is proportional to the magnitude of the input. The current produced through the floating-gate devices is a multiple of the input pulse duration and the stored weight pattern in devices 40–43. Note that only one input voltage pulse is applied to the cell of FIG. 6 for a given input. In other words, the positive input would have a pulse applied to lines 50 while line 51 remains grounded. Conversely, a negative input would have a pulse applied to line 51 while line 50 remains grounded.

The floating-gate potentials are represented in FIG. 6 by the voltages of $V_{40}$–$V_{43}$, corresponding to the floating-gate transistors 40–43. A positive weight pattern may be defined for the case in which $V_{41}$ is greater than $V_{40}$ and $V_{42}$ is greater than $V_{43}$. For this situation, when a positive input is applied (i.e., $t_{PP}>0$ and $t_{PN}=0$) more current will flow through the floating-gate transistor 41 relative to transistor 40. Therefore, the change in voltage produced at node 45 due to the discharge of capacitor 47 will be greater than the change in voltage produced at node 44 from the discharge of capacitor 46. This output condition may be arbitrarily defined as a negative output response. Logically, a positive output response would then correspond to the situation in which the change in voltage produced at node 44 was greater than the change in voltage produced at node 45.

Consistent with the convention described, a negative stored weight pattern would correspond to the situation in which the voltage $V_{40}$ is greater than $V_{41}$ and $V_{43}$ is greater than $V_{42}$. Applying a positive input (i.e., $t_{PP}>0$; $t_{PN}=0$) to the cell of FIG. 6 storing a negative weight pattern produces a discharge on line 52 which is greater relative to the discharge experienced on line 53, i.e., a positive output response. Applying a negative input (i.e., $t_{PP}=0$; $t_{PN}>0$) to the cell of FIG. 6 storing a negative weight produces a discharge on line 53 which is greater relative to that experienced on line 52, i.e., a negative response. Similarly, applying a negative input to a positive stored weight pattern results in a positive output response.

To recapitulate, in accordance with the conventions described above, a positive input applied to a positive weight produces a negative response; a negative input applied to a positive weight produces a positive response; a negative input applied to a negative weight produces a negative response; and a positive input applied to a negative weight results in a positive response. Thus, the cell of FIG. 6 delivers a full four-quadrant multiply, providing both excitatory and inhibitory connections.

It is appreciated that with respect to the discussion of FIGS. 2–6, the capacitors associated with the output current summing lines must be pre-charged before each new input pulse sequence or association cycle is applied.

Full incremental learning capabilities may be incorporated into the cell of FIG. 6 by including select transistors coupled to the sources of each of the floating-gate transistors 40–43. These transistors would be arranged in accordance with the teachings of FIG. 3 and FIG. 5. That is, each select device would have its gate coupled to a voltage select line and its source coupled to a separate programming potential line. Programming and erasing may then take place in a manner as described above in connection with FIGS. 2–5. Such a circuit configuration employing select transistors for programming and erasing ease is shown in FIG. 7.

FIG. 7 illustrates n-channel select transistors 60–63 coupled to floating-gate transistors 40–43, respectively. Voltage select line 67 is coupled to the gates of transistor 60 and 61 while select line 68 is coupled to the gates of transistor 62 and 63. Transistor 60 and 62 have their sources coupled to line 64, while devices 61 and 63 have their sources coupled to line 65. Lines 64 and 65 provide appropriate potentials to the sources of transistors 40–43 during programming, erasing and normal read operations.

Whereas many alternations and modifications of the present invention will no doubt become apparent to a person of ordinary skill in the art after having read the foregoing description, it is to be understood that the particular embodiments shown and described by way of illustration are in no way intended to be considered limiting. Therefore, reference to the details of the preferred embodiments are not intended to limit the scope of the claims which themselves recite only those features regarded as essential to the invention.

Thus, an adaptive synapse cell providing both excitatory and inhibitory connections in an associative network has been described.

We claim:

1. In an associative network, a synapse cell for providing a weighted connection between an input voltage line and an output summing line having an associated capacitance, said cell comprising a floating-gate transistor having a control gate coupled to said input voltage line, a drain coupled to a node of said output summing line, and a floating-gate for storing a charge corresponding to said weighted connection, said transistor producing a current in response to a voltage pulse of a certain duration being applied to said input voltage line, said current discharging said capacitance thereby lowering the voltage at said node by an amount directly proportional to the product of said certain duration and said charge.

2. The synapse cell of claim 1 further comprising programming means for programming said floating-gate transistor.

3. The synapse cell of claim 1 further comprising means for skewing said voltage pulse relative to other input voltage pulses to reduce noise in said network.

4. The synapse cell of claim 2, wherein said programming means comprises a field-effect transistor having a drain coupled to the source of said floating-gate transistor, a source coupled to a programming potential line for providing a programming potential, and a gate coupled to a select potential, said select potential controlling the coupling of said programming potential to said floating-gate transistor.

5. In an associative network, an adaptive synapse cell for providing both excitatory and inhibitory connections between an input voltage line and a neural summing device, said cell comprising:
   a first floating-gate transistor having a control gate coupled to said input voltage line, a floating-gate for storing a first charge and a drain coupled to a first output summing line, said first output summing line having a first capacitance associated therewith;
   a second floating-gate transistor having a control gate coupled to said input voltage line, a floating-gate for storing a second charge and a drain coupled to a second output summing line, said second output summing line having a second capacitance associated therewith, the difference between said first and said second charges defining a weight;
   said first and second output summing lines providing a differential signal to said neural summing device in response to a voltage pulse of a certain duration being applied to said input voltage line, a magnitude and sign of said differential signal being directly proportional to said certain duration and said weight.

6. The synapse cell of claim 5 further comprising programming means for programming said first and second floating-gate transistors.

7. The synapse cell of claim 5 further comprising means for skewing said voltage pulse relative to other input voltage pulses to reduce noise in said network.

8. The synapse cell of claim 6, wherein said programming means comprises a first select transistor coupled in series with the source of said first transistor and a second select device coupled in series with the source of said second floating-gate transistor, the gates of said select transistors being coupled to a select potential, said select potential controlling the coupling of a programming potential to said floating-gate transistors.

9. In an associative network, a synapse cell providing two-quadrant multiplication comprising:
   an input line;
   first and second output lines each having an associated capacitance;
   a first floating-gate transistor having a control gate coupled to said input line and a floating-gate for storing a first charge, said first floating-gate transistor discharging a first voltage from said capacitor associated with said first output line by a first amount in response to an input pulse of a certain duration applied to said input line;
   a second floating-gate transistor having a control gate coupled to said input line and a floating-gate for storing a second charge, said second floating-gate transistor discharging a second voltage from said capacitor associated with said second output line by a second amount in response to said input pulse, the voltage difference between said first and second amounts corresponding to the product of said certain duration and the charge difference between said first and second charges.

10. The synapse cell of claim 9 further comprising programming means for programming said first and second floating-gate transistors.

11. The synapse cell of claim 10, wherein said programming means comprises a first select transistor coupled in series with the source of said first floating-gate transistor and a second select transistor coupled in series with the source of said second floating-gate transistor, the gates of said select transistors being coupled to a programming line for providing a programming potential, said select potential controlling the coupling of said programming potential to said floating-gate transistors.

12. The synapse cell of claim 11 further comprising means for skewing said voltage pulse relative to other input voltage pulses to reduce noise in said network.

13. In an associative network, a synapse cell for providing both excitatory and inhibitory connections between a pair of input lines and a pair of output summing lines, said cell comprising:
   first and second floating-gate transistors having their drains coupled to one of said output summing lines;
   third and fourth floating-gate transistors having their drains coupled to the other of said output summing lines;
   said first and third transistors having their control gates coupled to one of said input lines and said second and fourth transistors having their control gates coupled to the other of said input lines;
   said transistors each having floating-gate members for storing electrical charge, said electrical charge regulating the current flow through said transistors such that when an input voltage of a certain duration is applied to either said one or said other of said input lines, a differential output voltage is produced across said output summing lines, the magnitude and sign of said differential output voltage being directly proportional to said electrical charge, the charge pattern formed by said floating-gate members of said first, second, third and fourth transistors, and the duration of said pulse applied to either said one or said other of said input lines.

14. The synapse cell of claim 13 further comprising programming means for programming said first, second, third and fourth floating-gate transistors.

15. The synapse cell of claim 14 further comprising means for skewing said input voltage pulse relative to other input voltage pulses applied to other cells to reduce noise in said network.

* * * * *